(12) United States Patent
Inaba

(10) Patent No.: US 9,589,867 B2
(45) Date of Patent: Mar. 7, 2017

(54) SEMICONDUCTOR DEVICE

(71) Applicant: FUJI ELECTRIC CO., LTD., Kawasaki (JP)

(72) Inventor: Tetsuya Inaba, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 14/879,682

(22) Filed: Oct. 9, 2015

(65) Prior Publication Data

US 2016/0126187 A1 May 5, 2016

(30) Foreign Application Priority Data

Oct. 30, 2014 (JP) ................................ 2014-221328

(51) Int. Cl.
| | |
|---|---|
| *H01L 23/498* | (2006.01) |
| *H01L 23/492* | (2006.01) |
| *H01L 23/15* | (2006.01) |
| *H01L 23/538* | (2006.01) |
| *H01L 23/373* | (2006.01) |

(Continued)

(52) U.S. Cl.
CPC .......... *H01L 23/4924* (2013.01); *H01L 23/15* (2013.01); *H01L 23/3735* (2013.01); *H01L 23/498* (2013.01); *H01L 23/49811* (2013.01); *H01L 23/49827* (2013.01); *H01L 23/49838* (2013.01); *H01L 23/49844* (2013.01); *H01L 23/5385* (2013.01); *H01L 23/5386* (2013.01); *H01L 23/049* (2013.01); *H01L 23/24* (2013.01); *H01L 25/072* (2013.01); *H01L 2224/48091* (2013.01); *H01L 2924/0002* (2013.01); *H01L 2924/19107* (2013.01)

(58) Field of Classification Search
CPC ............... H01L 23/4924; H01L 23/498; H01L 23/49811; H01L 23/49827; H01L 23/49838; H01L 23/49844; H01L 23/538; H01L 23/5384; H01L 23/5386; H01L 25/072
See application file for complete search history.

(56) References Cited

U.S. PATENT DOCUMENTS 5,512,790 A * 4/1996 Lachenmaier .......... H01L 24/06
200/1 R
5,591,993 A 1/1997 Nomura et al.
(Continued)

FOREIGN PATENT DOCUMENTS

JP 7-312410 11/1995

*Primary Examiner* — Yu Chen

(57) ABSTRACT

A semiconductor device includes: a semiconductor element having a gate and source electrodes; an insulating substrate which is provided with an insulating plate, a first circuit plate and a second circuit plate, the first circuit plate provided in a main surface of the insulating plate to be electrically connected to the gate electrode, the second circuit plate provided in the main surface to surround the first circuit plate and to be electrically connected to the source electrode; a first terminal, being column-shaped and electrically and mechanically connected to the first circuit plate; and a second terminal which is provided with a cylindrical body portion and support portions, the body portion has a through hole into which the first terminal is inserted with a gap, the support portions disposed in end portions of the body portion and electrically and mechanically connected to the second circuit plate.

9 Claims, 7 Drawing Sheets

(51) Int. Cl.
  *H01L 25/07*    (2006.01)
  *H01L 23/049*   (2006.01)
  *H01L 23/24*    (2006.01)

(56) References Cited

U.S. PATENT DOCUMENTS

| | | | |
|---|---|---|---|
| 7,602,059 B2* | 10/2009 | Nobutaka | H01L 23/49811 257/697 |
| 2012/0193121 A1* | 8/2012 | Mina | H01L 23/49827 174/102 R |
| 2015/0069463 A1* | 3/2015 | Hartmann | H01L 24/49 257/139 |
| 2015/0103498 A1* | 4/2015 | Lee | H01L 23/49811 361/737 |
| 2015/0279753 A1* | 10/2015 | Inaba | H01L 23/049 257/77 |

* cited by examiner

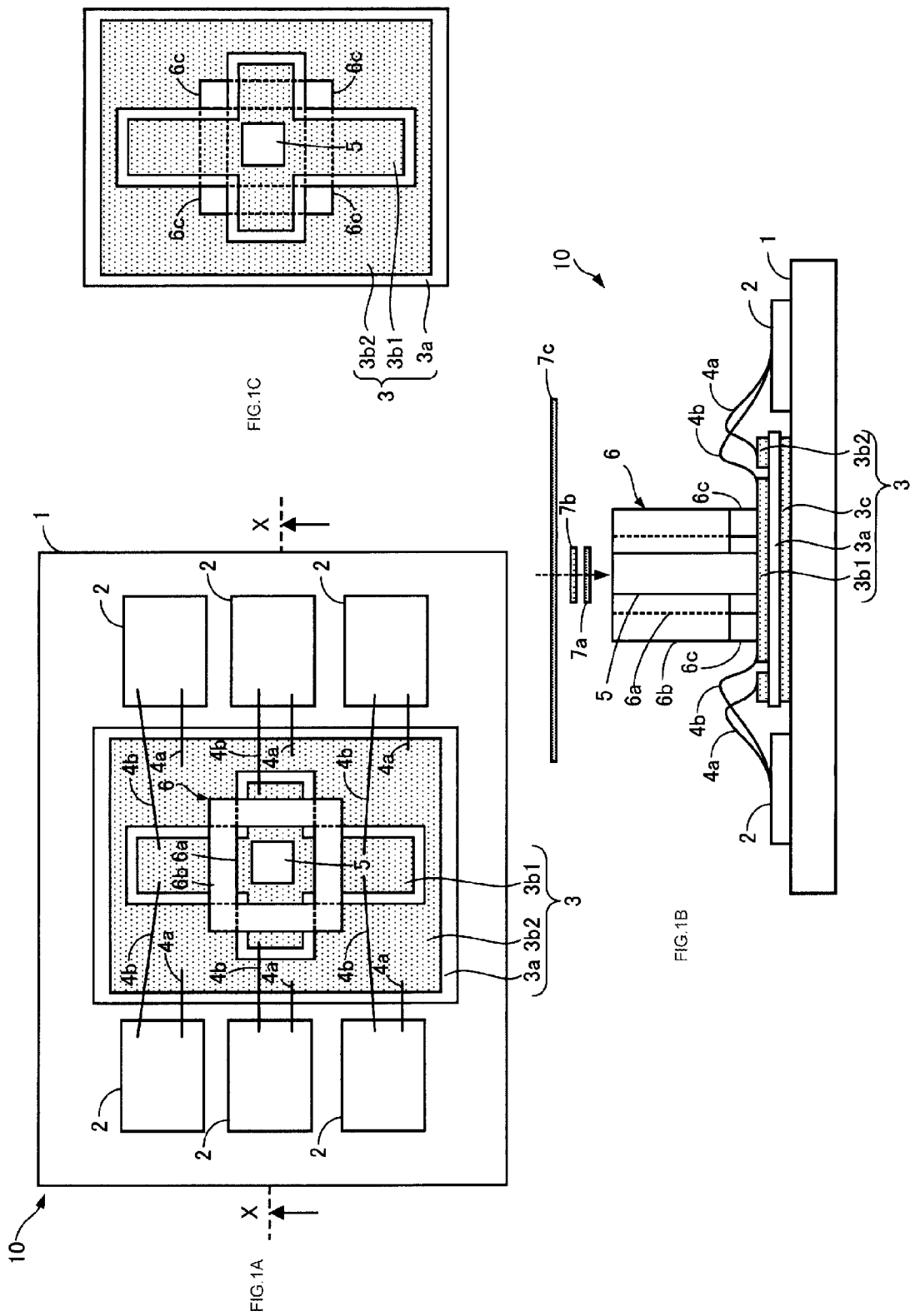

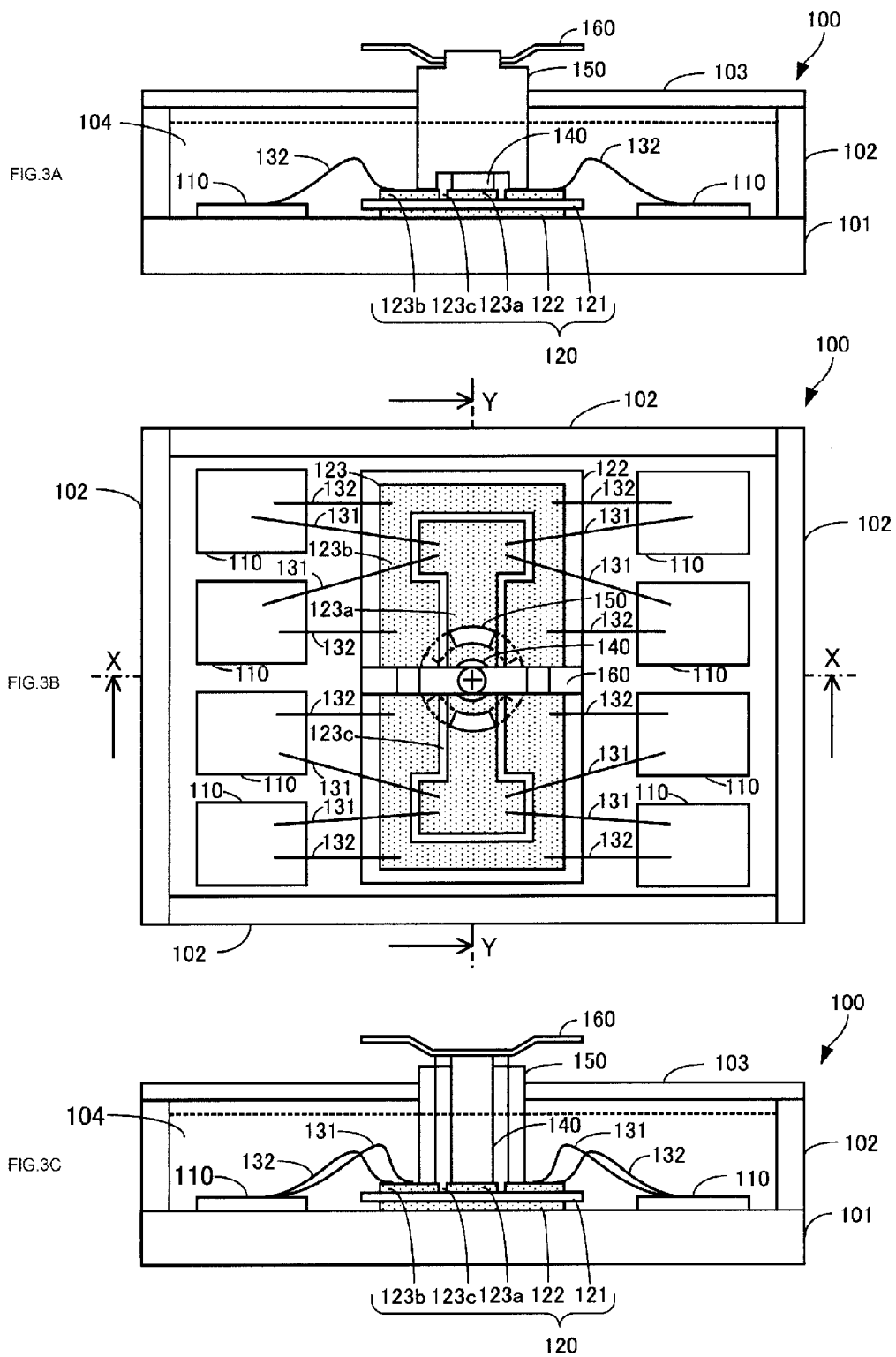

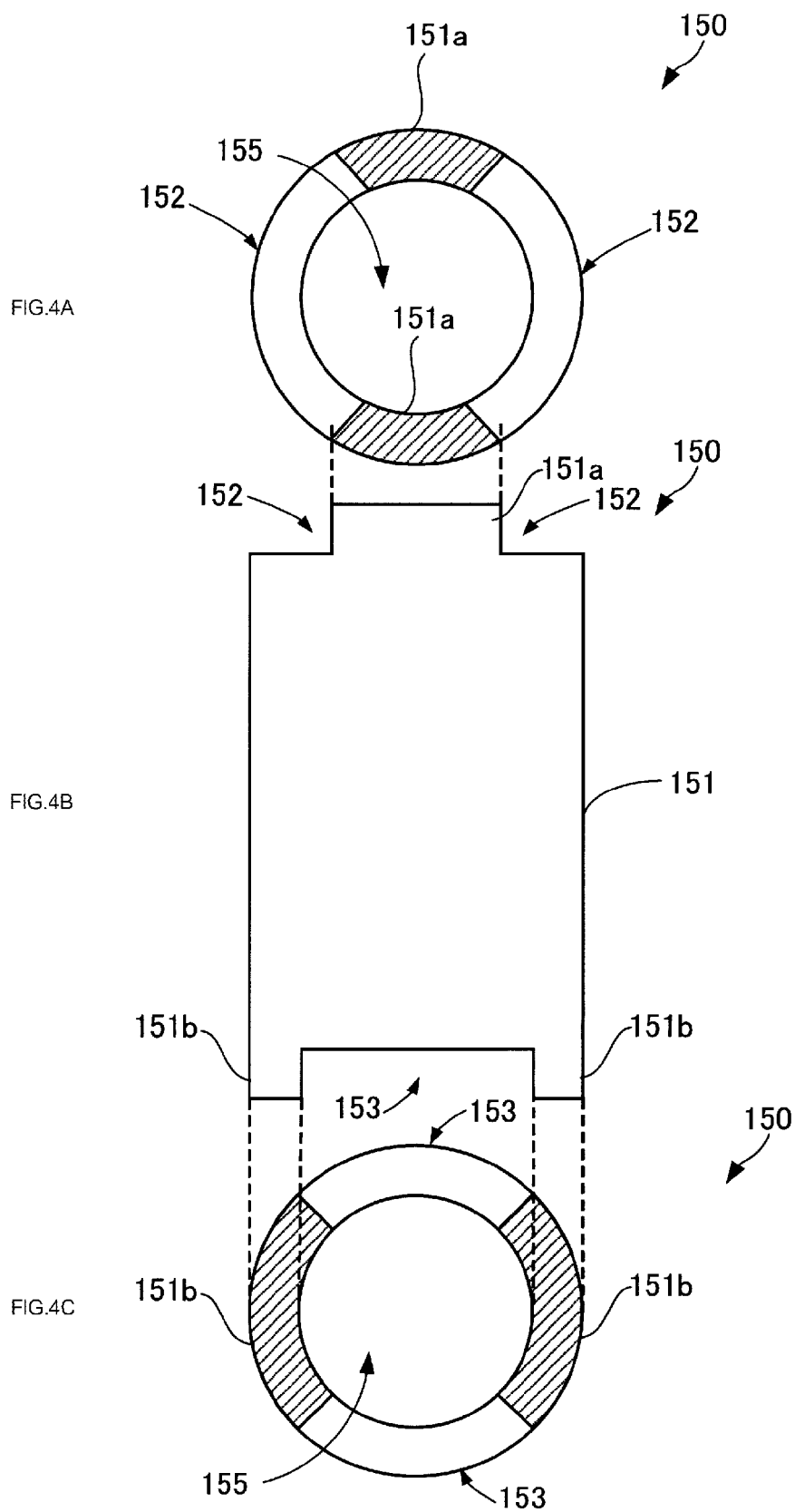

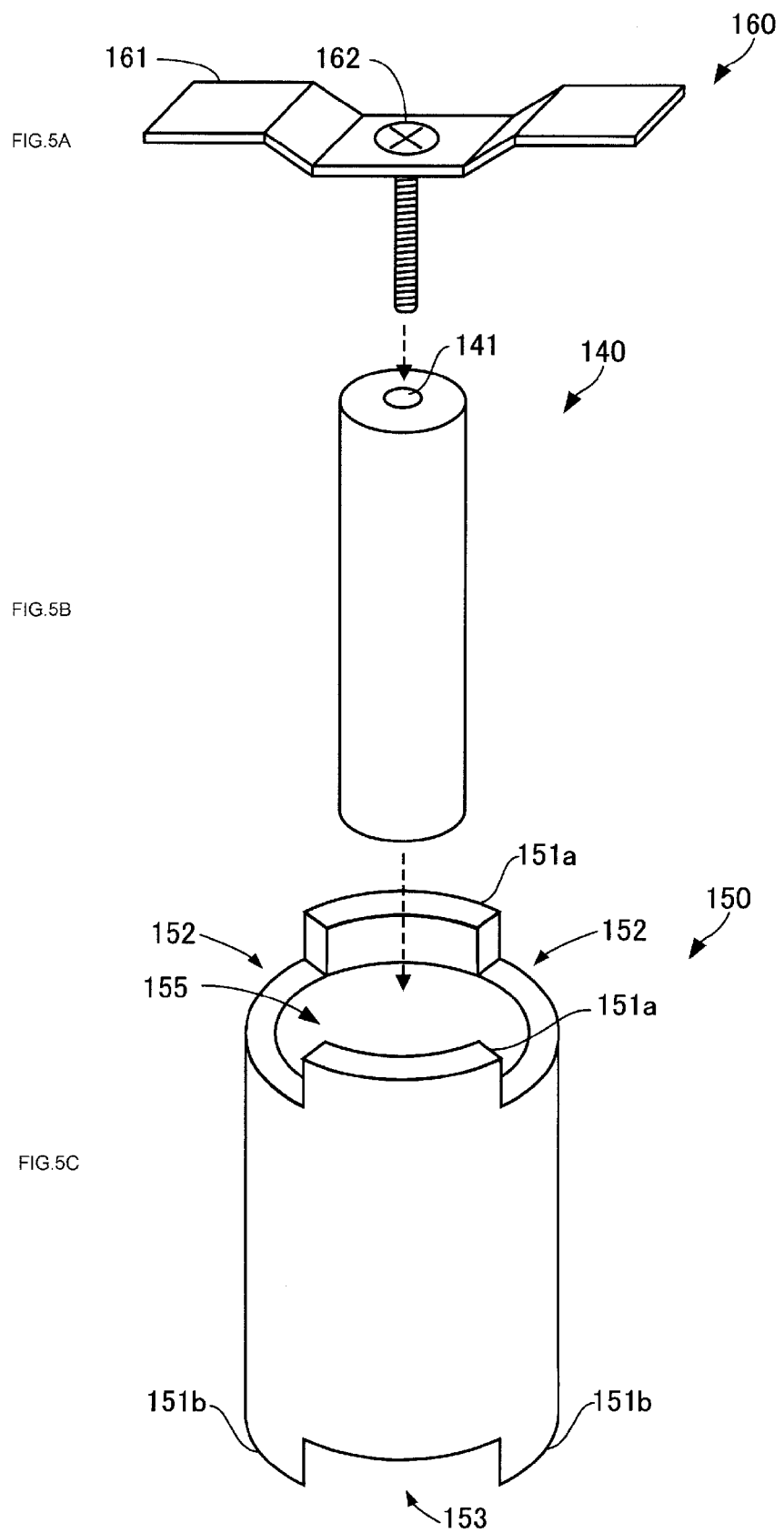

SEMICONDUCTOR DEVICE

CROSS-REFERENCE TO RELATED APPLICATIONS

This application is based on, and claims priority to, Japanese Patent Application No. 2014-221328, filed on Oct. 30, 2014, the content of which is incorporated herein by reference.

BACKGROUND

1. Field

The present disclosure relates to a semiconductor device.

2. Description of Related Art

A semiconductor module including a plurality of semiconductor elements such as Insulated Gate Bipolar Transistors (IGBTs) and Free Wheeling Diodes (FWDs) has been broadly used as one of semiconductor devices. For example, such semiconductor modules can be connected in series to achieve a function as a switching device, a converter, etc.

When such a semiconductor module is in operation, inductance occurs in its internal wiring etc. As the inductance increases, a transmission delay of a signal transmitted through the wiring increases and a time difference between ON and OFF operations of a gate voltage also increases. Accordingly, there is a fear that characteristics of the semiconductor module may deteriorate. Therefore, in order to reduce the inductance of the wiring, for example, there has been proposed a method in which a gate conductor is used to press a gate terminal of the semiconductor module to thereby make electric connection (see patent application publication JP-A-7-312410).

Although inductance in the semiconductor module can be reduced by use of the technique disclosed in JP-A-7-312410, there is a demand for further reduction in inductance.

SUMMARY

This disclosure has been accomplished in consideration of such a point. An aspect of the disclosure is to provide a semiconductor device in which the inductance of wiring is reduced.

According to an embodiment of the disclosure, there is provided a semiconductor device including: a semiconductor element which is provided with a gate electrode and a source electrode in its front surface; an insulating substrate which is provided with an insulating plate, a first circuit plate and a second circuit plate, the first circuit plate being provided on a main surface of the insulating plate to be electrically connected to the gate electrode, the second circuit plate being provided on the main surface to surround the first circuit plate and to be electrically connected to the source electrode; a first terminal which is shaped like a column and which is electrically and mechanically connected to the first circuit plate; and a second terminal which is provided with a cylindrical body portion and a support portion, the body portion being provided with a through hole into which the first terminal is inserted with a gap, the support portion being disposed in an end portion of the body portion to be electrically and mechanically connected to the second circuit plate.

According to the disclosed technique, the inductance of the wiring can be reduced and characteristics of the semiconductor device can be improved.

BRIEF DESCRIPTION OF THE DRAWINGS

These and/or other aspects and advantages will become apparent and more readily appreciated from the following description of the embodiments, taken in conjunction with the accompanying drawings of which:

FIGS. 1A through 1C are views showing a semiconductor device according to a first embodiment;

FIGS. 3A through 3C are views showing a semiconductor device according to a second embodiment;

FIGS. 4A through 4C are views showing a second terminal of the semiconductor device according to the second embodiment;

FIGS. 5A through 5C are perspective views showing a contact member, a first terminal and the second terminal of the semiconductor device according to the second embodiment;

DESCRIPTION OF EMBODIMENTS

Figure 2A:
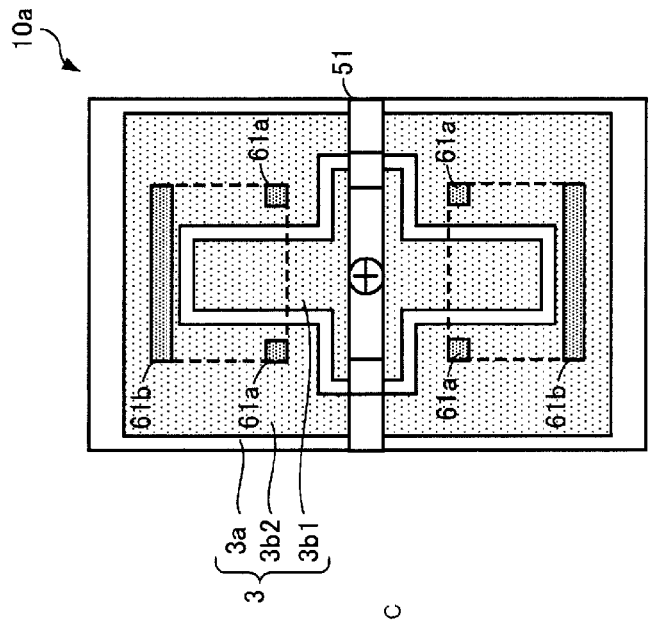
FIGS. 2A through 2D are views showing a semiconductor device as a reference example.

Embodiments will be described below with reference to the drawings.

Incidentally, the phrase "electrically and mechanically connected" used in the description of the following embodiments is not limited to the case where conductive members are bonded to each other by direct bonding but may include the case where the conductive members are bonded to each other through a conductive bonding material such as solder or a metal sintered material.

First Embodiment

A semiconductor device according to a first embodiment will be described with reference to FIGS. 1A through 1C. FIGS. 1A through 1C are views showing the semiconductor device according to the first embodiment.

FIG. 1A is a top view of the semiconductor device 10. FIG. 1B is a sectional view of the semiconductor device 10 taken along a chain line X-X in FIG. 1A, showing the case where external terminals are mounted on such a semiconductor device 10. FIG. 1C shows a top view of an insulating substrate 3 provided in the semiconductor device 10 and a support portion 6c electrically and mechanically connected to the insulating substrate 3.

The semiconductor device 10 has semiconductor elements 2, the insulating substrate 3, a first terminal 5, and a second terminal 6. The semiconductor device 10 further has a metal substrate 1.

For example, the semiconductor elements 2 are power semiconductor elements. Specifically, the semiconductor elements 2 are constituted by one kind or kinds of switching elements such as IGBTs, power MOSFETs (Metal Oxide Semiconductor Field Effect Transistors) and thyristors. Description will be made below in the case where the semiconductor elements 2 are power MOSFETs. The semiconductor elements 2 are disposed on the metal substrate 1. Each of the semiconductor elements 2 is provided with a gate electrode and a source electrode in its front surface. A control signal is inputted to the gate electrode. The source electrode serves for output. In addition, the semiconductor element 2 is provided with a drain electrode in its back surface. The drain electrode serves for input. The semiconductor element 2 is fixed to a main surface of the metal substrate 1 so that the drain electrode of the semiconductor element 2 can be electrically connected to the metal substrate 1. Incidentally, the number of semiconductor elements 2 is not limited to one, but a plurality of semiconductor elements 2 can be disposed on the metal substrate 1 as shown in FIGS. 1A through 1C.

The insulating substrate 3 is provided with an insulating plate 3a, a first circuit plate 3b1 and a second circuit plate 3b2. The first circuit plate 3b1 is provided on a main surface of the insulating plate 3a to be electrically connected to the gate electrodes of the semiconductor elements 2. The second circuit plate 3b2 is provided on the main surface of the insulating plate 3a to be disposed so as to surround the first circuit plate 3b1 and to be electrically connected to the source electrodes of the semiconductor elements 2. The insulating substrate 3 is further provided with a metal plate 3c provided on the other main surface of the insulating plate 3a. The insulating substrate 3 is disposed and fixed on the main surface of the metal substrate 1. In the case of the first embodiment, the first circuit plate 3b1 is shaped like a cruciform and electrically connected to the gate electrodes of the semiconductor elements 2 through wires 4b, for example, as shown in FIGS. 1A and 1B. In addition, the second circuit plate 3b2 surrounding the first circuit plate 3b1 is electrically insulated from the first circuit plate 3b1. The second circuit plate 3b2 is electrically connected to the source electrodes of the semiconductor elements 2 through wires 4a. Incidentally, in the embodiment, the second circuit plate 3b2 surrounds the first circuit plate 3b1 without any gap. However, even in the case where a gap is provided in the second circuit plate 3b2 so that a part of the second circuit plate 3b2 cannot surround the first circuit plate 3b1, the embodiment can be carried out without any difficulty as long as an equal electric potential is secured all over the second circuit plate 3b2. Further, even in the case where a plurality of second circuit plates 3b2 are provided on the insulating substrate 3, the embodiment can be carried out without any difficulty as long as the second circuit plates 3b2 are disposed in the periphery of the first circuit plate 3b1 so as to surround the first circuit plate 3b1 and an equal electric potential is secured all over the second circuit plates 3b2.

The first terminal 5 is provided on the first circuit plate 3b1 of the insulating substrate 3 to be electrically and mechanically connected to the first circuit plate 3b1. The first terminal 5 is made of a conductive material such as copper or aluminum. For example, as shown in FIGS. 1A through 1C, the first terminal 5 is shaped like a square column whose section is rectangular.

The second terminal 6 is provided with a body portion 6b and support portions 6c. The body portion 6b is shaped like a cylinder. A through hole 6a into which the first terminal 5 is inserted with a gap is disposed in the body portion 6b. In addition, the support portions 6c are disposed in end portions of the cylindrical body portion 6b to be electrically and mechanically connected to the second circuit plate 3b2. The second terminal 6 is made of a conductive material such as copper or aluminum. For example, as shown in FIGS. 1A and 1B, the body portion 6b is shaped like a square cylinder and the section of the through hole 6a is shaped like a rectangle. In addition, as shown in FIGS. 1A through 1C, the support portions 6c are disposed at four corners of the end portions of the body portion 6b. The support portions 6c are disposed on the second circuit plate 3b2 to be electrically and mechanically connected to the second circuit plate 3b2. In this manner, the second terminal 6 is electrically connected to the second circuit plate 3b2 through the support portions 6c. On the other hand, the second terminal 6 is electrically insulated from the first circuit plate 3b1 because the second terminal 6 is disposed to stride over the first circuit plate 3b1. In addition, although the first terminal 5 is inserted into the through hole 6a of the second terminal 6, the first terminal 5 and the second terminal 6 are electrically insulated from each other due to a gap formed between the first terminal 5 and the inner wall of the through hole 6a.

In addition, for example, as shown in FIG. 1B, the semiconductor device 10 is provided with a first external terminal 7a serving for a control signal and a second external terminal 7c serving for output. When the second external terminal 7c is pressed against the side of the insulating substrate 3, the second external terminal 7c is brought into pressure contact with a flat upper end portion of the second terminal 6 so as to be electrically connected thereto. Further, the first external terminal 7a electrically insulated from the second external terminal 7c by an insulating film 7b is brought into pressure contact with the first terminal 5 so as to be electrically connected thereto.

When an input voltage is applied to the back surface of the metal substrate 1 from the outside of the semiconductor device 10, the input voltage is applied to the drain electrodes of the semiconductor elements 2. In addition, when a control voltage is applied to the first terminal 5 via the first external terminal 7a, the control voltage is applied to the gate electrodes of the semiconductor elements 2 via the first circuit plate 3b1 and the wires 4b. The semiconductor elements 2 output an output current from their source electrodes in accordance with the applied control voltage. The output current is conducted to the body portion 6b from the support portions 6c of the second terminal 6 via the wires 4a and the second circuit plate 3b2 and outputted to the outside from the second external terminal 7c.

That is, the metal substrate 1 serves as an external input terminal through which the input voltage is applied to the semiconductor device 10. In this manner, inductance of external input wiring can be reduced remarkably in the non-insulation type semiconductor device 10 whose bottom exposes the external input terminal, in comparison with that in an insulation type semiconductor device whose bottom has an insulation structure.

Here, another semiconductor device will be described with reference to FIGS. 2A through 2D as a reference example relative to the semiconductor device 10. FIGS. 2A through 2D are views showing the semiconductor device as the reference example.

The semiconductor device 10a as the reference example is provided with a metal substrate 1, semiconductor elements 2 and wires 4a and 4b, in the same manner as in the first embodiment shown in FIGS. 1A through 1C. In FIGS. 2A through 2D, the metal substrate 1, the semiconductor elements 2 and the wires 4a and 4b are not shown but only an insulating substrate 3 and members disposed on the insulating substrate 3 are shown.

Figure 2C:
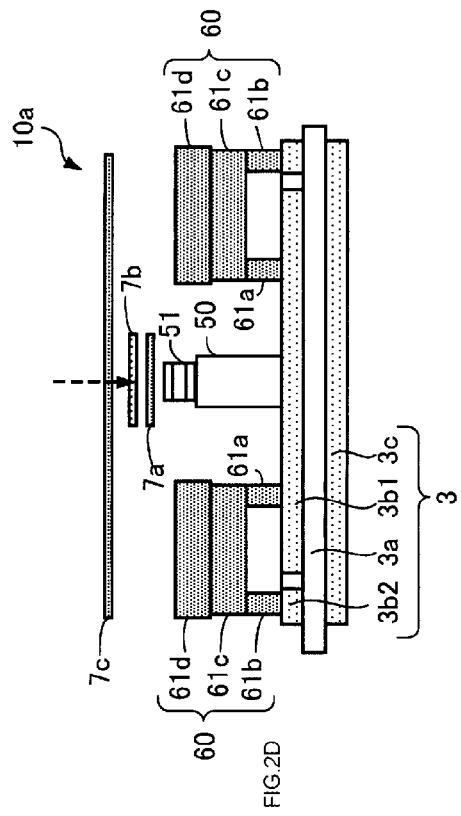
Figure 2B:
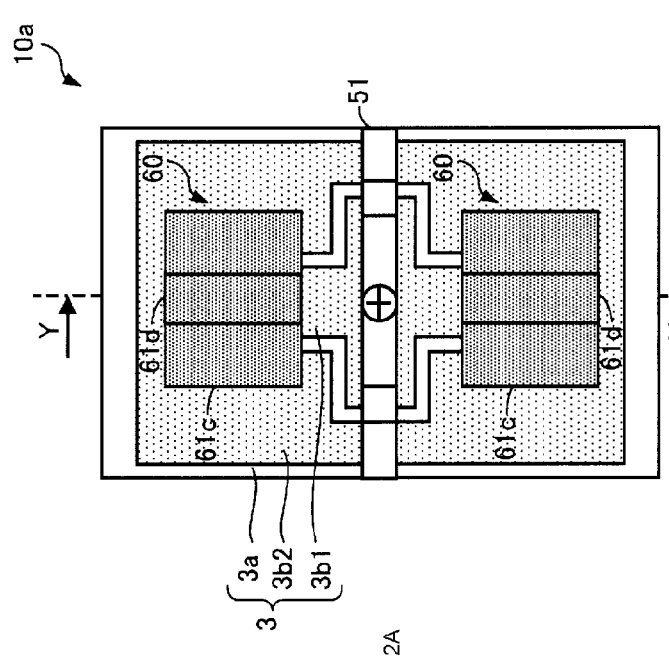
Figure 2D:
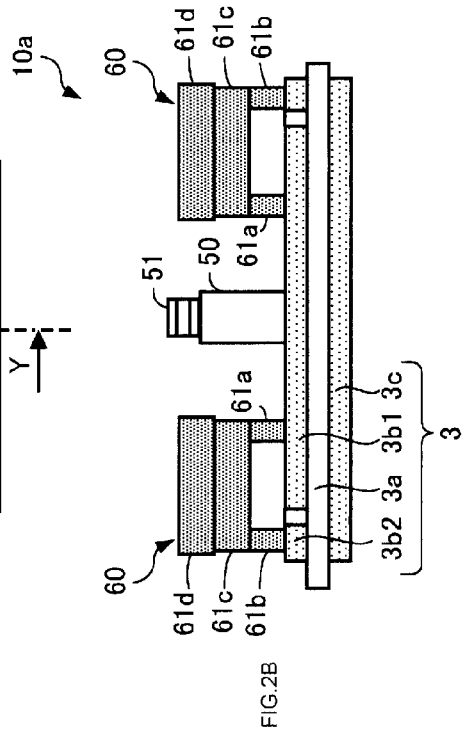

FIG. 2A shows a top view of the insulating substrate 3 of the semiconductor device 10a and the members disposed on the insulating substrate 3. FIG. 2B shows a sectional view taken along a chain line Y-Y in FIG. 2A. FIG. 2C shows a top view of the insulating substrate 3 and support portions 61a and 61b disposed on the insulating substrate 3. Further, FIG. 2D shows a view of the case where external terminals are disposed on such a semiconductor device 10a.

The semiconductor device 10a has the insulating substrate 3, a gate terminal 50, and source terminals 60 in addition to the not-shown metal substrate and the not-shown semiconductor elements.

In the semiconductor device 10a, the semiconductor elements and the insulating substrate 3 are disposed respectively on a main surface of the metal substrate, as shown in FIGS. 1A through 1C. Gate electrodes of the semiconductor elements are electrically connected to a first circuit plate 3b1 of the insulating substrate 3 by the wires. Source electrodes of the semiconductor elements are electrically connected to a second circuit plate 3b2 of the insulating substrate 3 by the wires.

The gate terminal 50 is provided on the first circuit plate 3b1 of the insulating substrate 3. The gate terminal 50 is made of a conductive material. For example, as shown in FIG. 2B, the gate terminal 50 is shaped like a column. A contact member 51 is provided in a front end portion of the gate terminal 50. Incidentally, the details of the contact member 51 will be described in a second embodiment (contact member 160 in FIG. 5A).

Each of the source terminals 60 is made of a conductive material such as copper or aluminum. As shown in FIG. 2B, the source terminal 60 has a configuration in which the support portions 61a and 61b, a body portion 61c, and a contact portion 61d are laminated sequentially. Of these portions, the support portions 61a and 61b are disposed on the bottom of the body portion 61c to be electrically and mechanically connected to the second circuit plate 3b2, as shown in FIG. 2C. The two source terminals 60 are disposed on the insulating substrate 3 so that the gate terminal 50 can be interposed between the two source terminals 60.

In the semiconductor device 10a, when a second external terminal 7c is pressed against the side of the insulating substrate 3, the second external terminal 7c is brought into pressure contact with the contact portions 61d of the source terminals 60 so as to be electrically connected thereto, as shown in FIG. 2D. In addition, a first external terminal 7a electrically insulated from the second external terminal 7c by an insulating film 7b is brought into pressure contact with the contact member 51 provided on the gate terminal 50, so as to be electrically connected thereto.

In this manner, one second external terminal 7c is brought into pressure contact with two source terminals 60 in the semiconductor device 10a. Therefore, if the heights of the source terminals 60 are uneven, one-side contact of the second external terminal 7c with the source terminals 60 may occur. When one-side contact of the second external terminal 7c on the source terminals 60 occurs, a local heating or discharging phenomenon may occur in the source terminals 60 or a problem such as mechanical breakdown of the semiconductor device 10a itself may occur due to an uneven load. In addition, in order to prevent such one-side contact of the second external terminal 7c, it is necessary to adjust the source terminals 60 accurately. Thus, the manufacturing cost of the semiconductor device 10a increases.

On the other hand, in the semiconductor device 10 according to the first embodiment, one second terminal 6 whose upper end portion is flat is used. Accordingly, it is not necessary to make the accurate adjustment but it is still possible to prevent the one-side contact. Therefore, occurrence of a local heating or discharging phenomenon or occurrence of mechanical breakdown in the semiconductor device 10 can be suppressed inexpensively.

Further, since the gap between the first terminal 5 and the inner wall of the through hole 6a of the second terminal 6 is made narrow, inductance occurring in the first terminal 5 and the second terminal 6 can be offset so that wiring inductance can be reduced. As a result, occurrence of delay of signal transmission can be suppressed.

Incidentally, when the gap between the first terminal 5 and the inner wall of the through hole 6a of the second terminal 6 is made as narrow as possible in the semiconductor device 10, the wiring inductance can be made lower. On the other hand, since the semiconductor device 10 is sealed by a sealing resin, the gap between the first terminal 5 and the inner wall of the through hole 6a of the second terminal 6 can be also sealed by the sealing resin. Therefore, it is preferable that the gap between the first terminal 5 and the inner wall of the through hole 6a of the second terminal 6 is made narrow enough to inject the sealing resin therein. In consideration of these points, it is preferable that the gap between the first terminal 5 and the second terminal 6 is, for example, from 0.5 mm to 1 mm. In addition, when the gap between the first terminal 5 and the inner wall of the through hole 6a of the second terminal 6 is sealed by the sealing resin, a short circuit can be prevented from occurring between the first terminal 5 and the second terminal 6.

Second Embodiment

A semiconductor device according to a second embodiment will be described with reference to FIGS. 3A through 3C. FIGS. 3A through 3C are views showing the semiconductor device according to the second embodiment.

Incidentally, FIG. 3A shows a side perspective view of the semiconductor device 100. FIG. 3B shows a top perspective view of the semiconductor device 100. FIG. 3C shows a sectional view taken along a chain line X-X in FIG. 3B.

In the semiconductor device 100, semiconductor elements 110 and an insulating substrate 120 are mounted on a metal substrate 101. A first terminal 140 and a second terminal 150 are provided on the insulating substrate 120. Further, the respective constituents on the metal substrate 101 in the semiconductor device 100 are received in a casing which is sealed (up to a dotted line in FIG. 3A) by a sealing resin 104 and which is constituted by frame elements 102 and a cover 103. Incidentally, the cover 103 is not shown in FIG. 3B which will be described later.

Although not shown, each of the semiconductor elements 110 is provided with a gate electrode, a source electrode and a drain electrode. The gate electrode and the source electrode are provided in the front surface of the semiconductor element 110 while the drain electrode is provided in the back surface of the semiconductor element 110. A gate voltage is applied to the gate electrode. A source current is outputted from the source electrode. A drain voltage is applied to the drain electrode. The semiconductor elements 110 are power semiconductor elements which are constituted by one kind or kinds of switching elements such as IGBTs and power MOSFETs, as described above. Such semiconductor elements 110 are fixed to a main surface of the metal substrate 101 so that the drain electrodes of the semiconductor elements 110 can be electrically and mechanically connected to the metal substrate 101.

The insulating substrate 120 has an insulating plate 121, a first circuit plate 123a and a second circuit plate 123b. The insulating plate 121 is made of ceramics. The first circuit plate 123a and the second circuit plate 123b are made of copper etc. and provided on a main surface of the insulating plate 121. Further, the insulating substrate 120 has a metal plate 122 provided on the other main surface of the insulating plate 121. The insulating substrate 120 is fixed to the main surface of the metal substrate 101, for example, by use of a solder material. Incidentally, when the insulating substrate 120 is fixed to the metal substrate 101 by use of an adhesive agent, the metal plate 122 can be dispensed with.

In the case of the second embodiment, for example, as shown in FIG. 3B, the first circuit plate 123a is shaped like a rectangle whose opposite end portions are wider than its intermediate portion. The first circuit plate 123a is electrically connected to the gate electrodes of the semiconductor elements 110 by wires 131. In addition, the second circuit plate 123b surrounding the first circuit plate 123a is electrically insulated from the first circuit plate 123a by an insulating film 123c which is disposed between the first circuit plate 123a and the second circuit plate 123b. The second circuit plate 123b is electrically connected to the source electrodes of the semiconductor elements 110 by wires 132.

The first terminal 140 is provided on the first circuit plate 123a of the insulating substrate 120 so as to be electrically and mechanically connected to the first circuit plate 123a at its lower end portion. The first terminal 140 is shaped like a circular column. A contact member 160 is provided on an upper end portion of the first terminal 140. Each of the first terminal 140 and the contact member 160 is made of a conductive material such as copper or aluminum.

The second terminal 150 is shaped like a circular cylinder. The first terminal 140 is inserted into the second terminal 150. The second terminal 150 is electrically and mechanically connected to the second circuit plate 123b at its lower end portion. The second terminal 150 is made of a conductive material such as copper or aluminum.

Incidentally, the sealing resin 104 is injected into a gap between the second terminal 150 and the first terminal 140 (up to the dotted line in FIG. 3A).

The details of such a second terminal 150 will be described with reference to FIGS. 4A through 4C. FIGS. 4A through 4C are views showing the second terminal of the semiconductor device according to the second embodiment. FIG. 4A shows a top view of the second terminal 150. FIG. 4B shows a side view of the second terminal 150. FIG. 4C shows a bottom view of the second terminal 150.

The second terminal 150 is shaped like a circular cylinder in which a through hole 155 is provided in a body portion 151. Two notch portions 152 are disposed in an upper end portion of the body portion 151 to be opposed to each other. Two protruding source contact portions 151a are disposed in the upper end portion of the body portion 151. Further, two notch portions 153 are disposed in a lower end portion of the body portion 151 to be opposed to each other. Two protruding support portions 151b are disposed in the lower end portion of the body portion 151. Particularly, each notch portion 153 is formed to be wider in width than the intermediate portion of the first circuit plate 123a. End portions of the two source contact portions 151a are flush with each other.

Next, the layout of the first terminal 140 and the second terminal 150 on the insulating substrate 120 will be described with reference to FIGS. 3A through 3C and FIGS. 5A through 5C. FIGS. 5A through 5C are perspective views showing the contact member, the first terminal and the second terminal of the semiconductor device according to the second embodiment. Incidentally, FIG. 5A shows the contact member 160. FIG. 5B shows the first terminal 140. FIG. 5C shows the second terminal 150.

The contact member 160 has a spring plate 161 and a screw 162 provided in a center portion of the spring plate 161. The spring plate 161 is made of a conductive material such as copper provided with predetermined elastic force. For example, as shown in FIG. 5A, the spring plate 161 is formed into a shape whose opposite ends are raised up.

A screw hole 141 is disposed in an upper end portion of the first terminal 140. The diameter of the section of the first terminal 140 has a size enough to be inserted into a through hole 155 of the second terminal 150, as shown in FIG. 5C.

As shown in FIG. 3A, the second terminal 150 has the support portions 151b which are electrically and mechanically connected to the second circuit plate 123b of the insulating substrate 120. On this occasion, the notch portions 153 are disposed to stride over the first circuit plate 123a of the insulating substrate 120. Therefore, the second terminal 150 is electrically insulated from the first circuit plate 123a without making any contact therewith. Incidentally, the support portions 151b of the second terminal 150 are bonded to the second circuit plate 123b, for example, by a solder material.

In addition, the first terminal 140 is disposed to be inserted into the through hole 155 of the second terminal 150. The lower end portion of the first terminal 140 is electrically and mechanically connected to the first circuit plate 123a, for example, by a solder material.

Further, in the contact member 160, the spring plate 161 is fastened and attached to the screw hole 141 in the upper end portion of the first terminal 140 by the screw 162. In addition, the contact member 160 is attached so that the spring plate 161 is disposed in the notch portions 152 of the second terminal 150 without making contact with the second terminal 150.

Figure 6A:
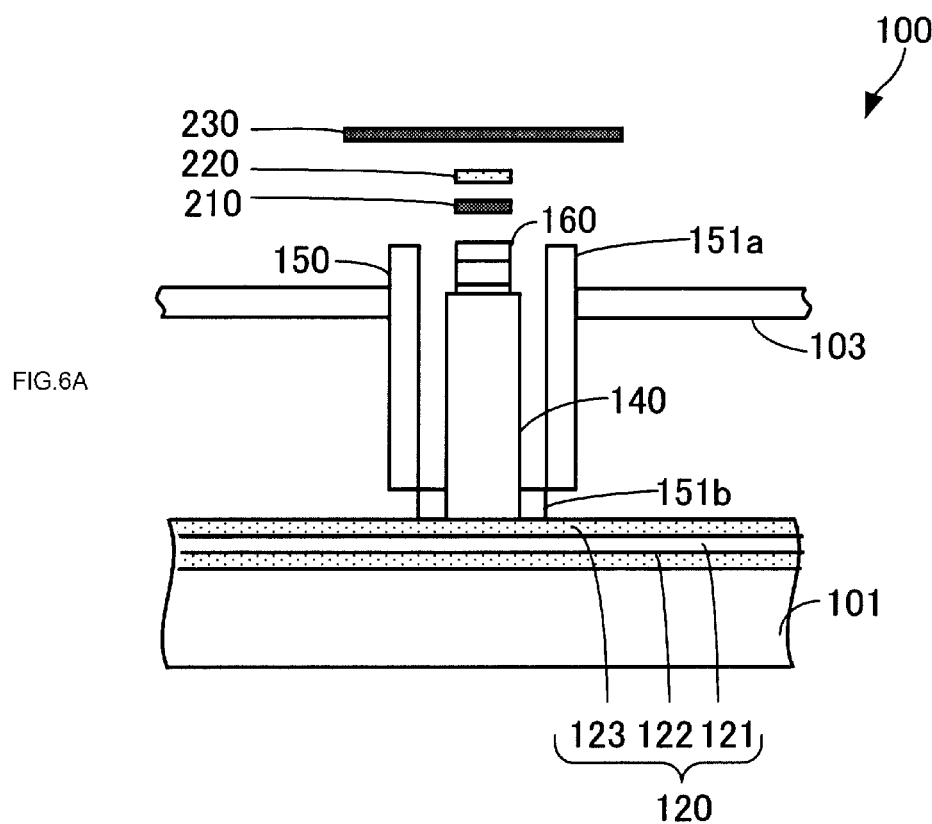
FIGS. 6A and 6B are views for explaining contact of external terminals with the semiconductor device according to the second embodiment.
Figure 6B:
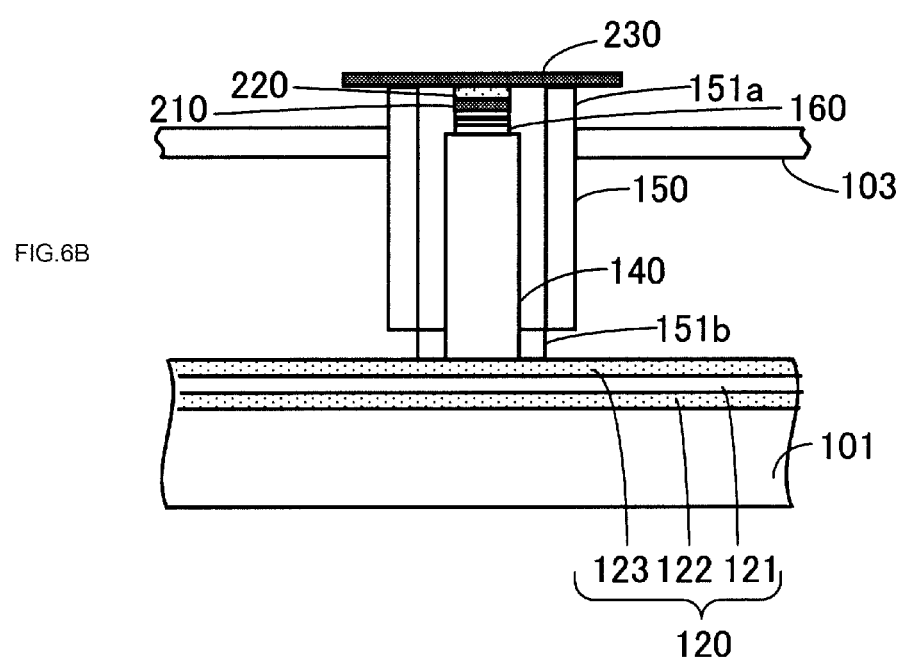

Next, contact of external terminals with such a semiconductor device 100 will be described with reference to FIGS. 6A and 6B. FIGS. 6A and 6B are views for explaining the contact of the external terminals with the semiconductor device according to the second embodiment.

Incidentally, FIG. 6A is a sectional view of the semiconductor device 100 taken along a chain line Y-Y in FIG. 3B, showing a state in which the external terminals have not been brought into pressure contact with the semiconductor device 100 yet. FIG. 6B shows a state in which the external terminals have been brought into pressure contact with the semiconductor device 100.

The external terminals to be brought into pressure contact with the semiconductor device 100 consist of a first external terminal 210 which makes contact with the contact member 160, and a second external terminal 230 which makes contact with the source contact portions 151a of the second terminal 150. Incidentally, an insulating film 220 is provided between the first external terminal 210 and the second external terminal 230. Thus, the first external terminal 210 is electrically insulated from the second external terminal 230.

As shown in FIG. 6B, when the second external terminal 230 is pressed against the side of the cover 103, the second external terminal 230 is brought into pressure contact with the flush source contact portions 151a of the second terminal 150. Further, the first external terminal 210 is brought into pressure contact with the contact member 160 provided on the first terminal 140. On this occasion, the contact between the first external terminal 210 and the contact member 160 can be kept properly due to the elastic force of the spring plate 161 of the contact member 160.

Here, when an input voltage is applied to the back surface of the metal substrate 101 serving as an external input terminal, the input voltage is applied to the drain electrodes in the back surfaces of the semiconductor elements 110. In addition, when a control voltage is applied to the first terminal 140 from the first external terminal 210 via the contact member 160, the control voltage is applied to the gate electrodes of the semiconductor elements 110 via the first circuit plate 123a and the wires 131. When the input voltage and the control voltage are applied to the semiconductor elements 110 in this manner, the semiconductor elements 110 output, from their source electrodes, an output current corresponding to the control voltage. The output current is conducted to the body portion 151 from the support portions 151b of the second terminal 150 via the wires 132 and the second circuit plate 123b. Further, the output current is conducted to the second external terminal 230 from the source contact portions 151.

Incidentally, when the pressure contact of the second external terminal 230 with the second terminal 150 is stopped to thereby separate the first external terminal 210 from the contact member 160 of the first terminal 140, the contact member 160 returns to the original state shown in FIG. 3C due to its elastic force.

Thus, in the semiconductor device 100 according to the second embodiment, the gap between the first terminal 140 and the second terminal 150 can be made narrow in the same manner as that according to the first embodiment. Therefore, inductance occurring in the first terminal 140 and the second terminal 150 can be offset so that the inductance can be reduced. Accordingly, occurrence of delay of signal transmission can be suppressed. Further, in the second embodiment in which the two terminals are shaped like a circular cylinder and a circular column, the gap between the first terminal 140 and the second terminal 150 does not depend on the direction of the first terminal 140, in comparison with that in the first embodiment in which the two terminals are shaped like a square cylinder and a square column. Therefore, accurate adjustment is not required for setting the first terminal 140 so that the manufacturing cost can be reduced. Incidentally, it is preferable that the gap between the first terminal 140 and the second terminal 150 is, for example, from 0.5 mm to 1 mm, in the same manner as that in the first embodiment.

In the second terminal 150 of the semiconductor device 100 according to the second embodiment, the pair of source contact portions 151a are formed to be flush with each other. Therefore, accurate adjustment is not required but one-side contact of the second terminal 150 can be prevented from occurring due to its uneven height when the second external terminal is brought into contact with the second terminal 150. It is therefore possible to suppress occurrence of local heating or discharging or occurrence of mechanical breakdown in the semiconductor device 100.

In addition, in the second terminal 150, in the top view (or the bottom view), the pair of opposed support portions 151b are provided to rotate by 90 degrees with respect to the pair of opposed source contact portions 151a (FIGS. 5A through 5C). Thus, when the second external terminal 230 is used to make pressure contact with the source contact portions 151a of the second terminal 150, the pressing force of the support portions 151b against the second circuit plate 123b is reduced, in comparison with the case where the pair of opposed support portions 151b is 0 degree with respect to (coincident with) the pair of opposed source contact portions 151a. Therefore, even when the second external terminal 230 is brought into pressure contact with the second terminal 150, occurrence of damage in the second circuit plate 123b or in the lower end portion of the second terminal 150 can be suppressed so that deterioration of characteristics of the semiconductor device 100 can be suppressed.

Third Embodiment

An example in which another second terminal is used in the case of the second embodiment will be described in a third embodiment.

Figure 7:
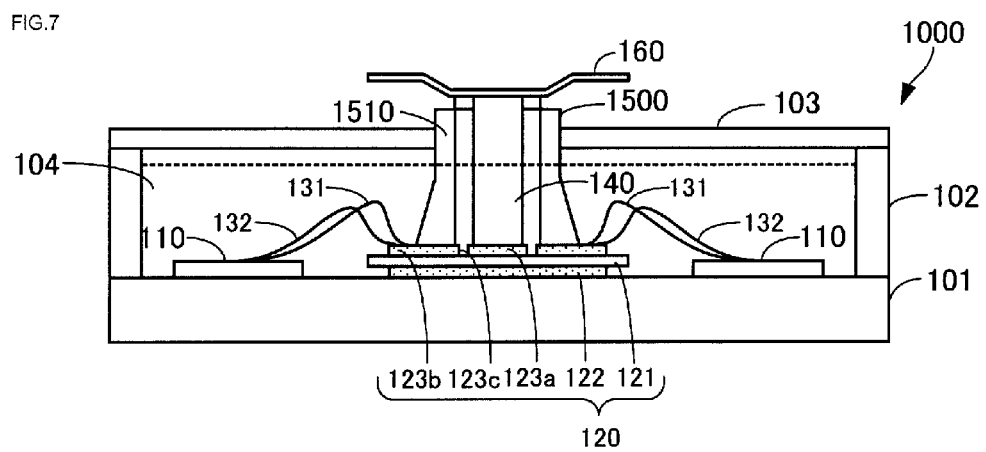
FIG. 7 is a view showing a semiconductor device according to a third embodiment.

FIG. 7 is a view showing a semiconductor device according to the third embodiment. The semiconductor device 1000 is formed in such a manner that a second terminal 1500 is provided in the semiconductor device 100 (FIGS. 3A through 3C) according to the second embodiment.

The second terminal 1500 is formed into a shape in which the outer diameter of a body portion 1510 of the second terminal 1500 is widened gradually toward its lower end portion. The remaining configuration of the semiconductor device 1000 is the same as that of the semiconductor device 100.

In the semiconductor device 1000, the outer diameter of the body portion 1510 of the second terminal 1500 is widened gradually toward its lower end portion. Accordingly, the area occupied by the support portions can be made wider. Therefore, even when the second external terminal 230 is pressed against the side of the cover 103, pressure against the insulating substrate 120 in the lower end portion of the second terminal 1500 can be reduced. Therefore, occurrence of mechanical breakdown of the semiconductor device can be further suppressed.

Incidentally, the second terminal 6 of the semiconductor device 10 according to the first embodiment may be also formed into a shape with a section whose diameter is widened gradually toward its lower end portion in the same manner as the second terminal 1500 according to the third embodiment so that occurrence of damage in the lower end portion of the second terminal 6 and the second circuit plate 3b2 can be suppressed.

In addition, although the case where power MOSFETs are used as the semiconductor elements 2 in the aforementioned embodiment, the disclosure is not limited thereto. For example, IGBTs may be used as the semiconductor elements 2. In this case, the source electrodes and the drain electrodes in the aforementioned embodiment may be replaced by emitter electrodes and collector electrodes respectively. In addition, other switching elements may be used alternatively.

Although a few embodiments have been shown and described, it would be appreciated by those skilled in the art that changes may be made in these embodiments without departing from the principles and spirit of the invention, the scope of which is defined in the claims and their equivalents.

What is claimed is:
1. A semiconductor device comprising:
    a semiconductor element including a gate electrode and a source electrode in its front surface;
    an insulating substrate including
        an insulating plate,
        a first circuit plate provided on a main surface of the insulating plate and electrically connected to the gate electrode, and
        a second circuit plate provided on the main surface, surrounding the first circuit plate, and electrically connected to the source electrode;
    a first terminal, being column-shaped and electrically and mechanically connected to the first circuit plate; and
    a second terminal including
        a cylindrical body portion having a through hole into which the first terminal is inserted with a gap between the first terminal and the body portion, and
        a support portion disposed in an end portion of the body portion and electrically and mechanically connected to the second circuit plate.
2. The semiconductor device according to claim 1, wherein
    the semiconductor element further includes a drain electrode in its back surface, and the semiconductor device further comprises a metal substrate electrically and mechanically connected to the drain electrode of the semiconductor element and fixed to the insulating substrate.

3. The semiconductor device according to claim 2, wherein the metal substrate is an external terminal configured to receive an input.

4. The semiconductor device according to claim 1, wherein the second terminal further includes at least one notch portion in the support portion, each of the at least one notch portion disposed to stride over the first circuit plate.

5. The semiconductor device according to claim 4, wherein the at least one notch portion is a plurality of notch portions, each of the plurality of notch portions disposed in the support portion to be opposed to another of the plurality of notch portions.

6. The semiconductor device according to claim 1, wherein the gap between the first terminal and an inner wall of the through hole of the second terminal is from 0.5 mm to 1 mm.

7. The semiconductor device according to claim 6, wherein the gap is filled with a sealing resin.

8. The semiconductor device according to claim 1, wherein
the first terminal has a circular column shape, and
the body portion of the second terminal has a circular cylindrical shape.

9. The semiconductor device according to claim 8, wherein the section of the body portion perpendicular to an extending direction of the body portion has a diameter that is gradually larger toward the support portion.

* * * * *